United States Patent [19]
Bates et al.

[11] Patent Number: 5,210,723
[45] Date of Patent: May 11, 1993

[54] MEMORY WITH PAGE MODE

[75] Inventors: Matthew D. Bates, Southampton; Adrian C. Gay, Fareham; Roderick M. West, Chandler's Ford, all of Great Britain; Todd Williams, Essex, Vt.

[73] Assignee: International Business Machines Corporation, Armonk, N.Y.

[21] Appl. No.: 606,262

[22] Filed: Oct. 31, 1990

[51] Int. Cl.⁵ ............................................. G11C 8/00
[52] U.S. Cl. ........................... 365/238.5; 365/230.03; 365/230.06; 365/233.5
[58] Field of Search ............... 365/230.03, 238.5, 235, 365/193, 194, 230.06, 239, 233.5

[56] References Cited

U.S. PATENT DOCUMENTS 4,546,451 10/1985 Bruce .................................. 364/900
4,586,167 4/1986 Fujishima et al. ............... 365/238.5

FOREIGN PATENT DOCUMENTS

WO8204147 11/1982 PCT Int'l Appl. .

Primary Examiner—Joseph A. Popek
Attorney, Agent, or Firm—Mark F. Chadurjian

[57] ABSTRACT

In a memory addressable by row and by column and operable in page mode whereby multiple column cycles are performed within a single row cycle, an arrangement is provided for stepping the row address for selected column cycles whereby sustained page mode operation can be provided throughout memory address space. Preferably, stepping occurs in response to a row change signal supplied when a column address strobe becomes active and the direction of stepping is determined by a mode signal supplied when a row address strobe becomes active. Memory segmentation is employed to facilitate simultaneous activation and restoring of multiple rows.

12 Claims, 5 Drawing Sheets

MEMORY WITH PAGE MODE

FIELD OF THE INVENTION

The invention relates to a memory system operable under page mode.

BACKGROUND OF THE INVENTION

Memories such as random access and read only memories which are randomly addressable are usually arranged as a matrix of storage locations or groups of storage locations which are addressable by row and by column. Various organizations of memory locations are possible. For example, a 1Mbit memory can be arranged as 256K words of 4 bits addressable on 512 rows and 512 columns, so that addressing a specific row and column gives access to a group of 4 storage locations. An alternative organization is as 128K words of 8 bits addressable either on 512 rows and 256 columns or 256 rows and 512 columns, so that addressing a specific row and column gives access to a group of 8 storage locations. It will be appreciated that these are just two of many possible organizations.

There are many different types of randomly addressable memories. Examples are read only memories (ROMs), programmable ROMs (PROMs), static random access memories (SRAM), dynamic RAM (DRAM) and video RAM (VRAM), the latter being a specific type of DRAM. These memories are normally accessed by inputting address signals which first select a row and then select a column within the memory, in response to timing signals termed RAS (row address strobe) and CAS (column address strobe), respectively. During such normal accessing of the RAM the row address cycles alternate with column address cycles, each pair of row and column cycles allowing access to the bit or bits having a specified row and column address.

In some memories however, an additional access method, generally termed "page mode", is provided in accordance with which multiple column cycles are performed within a single row cycle. The term "static column mode" has been used for this type of access method. However, the term "page mode" is widely understood in the art as being a generic term covering this type of access method Conventionally, a row address is selected for a page mode row cycle and, within that row cycle, multiple column cycles are performed to access the memory at selected column addresses in that row. By avoiding the need for a new row address strobe to be provided each memory access, fast access can be had to data occurring within a single row.

One application for RAM is as an all points addressable (APA) display memory in a display system. In modern APA raster displays, an image to be viewed is stored point-by-point as picture element (pixel) data in a memory subsystem frame buffer, comprised of dynamic random access memory (DRAM) or video random access memory (VRAM). These designs allow arbitrary update of pixel contents for display of arbitrarily complex images.

The information stored is either periodically refreshed to restore the image on the video monitor or is updated to modify the displayed image. For raster scan displays, horizontal line updates generally occur in page mode, wherein data on an accessed row is updated in multiple column locations, corresponding to adjacent pixels on a scan line, for enhanced update bandwidth. However, vertical line updates generally require multiple sequential row accesses to perform image modification at random cycle time performance, as much as four times longer than that of page mode update.

Figure 1:
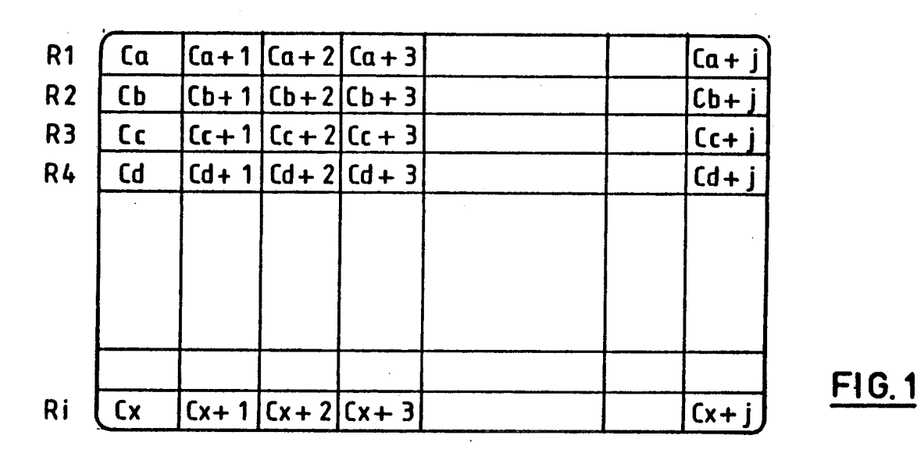
FIG. 1 illustrates a typical display memory, or frame buffer, bit map of a raster scan display, showing row and column locations of pixel data stored in the RAM. Horizontal updates are shown to lie on a row across multiple column addresses (R[1], C[a]–C[a+j]), accessible in page mode, while vertical lines are shown to lie across multiple rows at a given column address (R[1]–R[i], C[a,b,c,d]).
Figure 2:
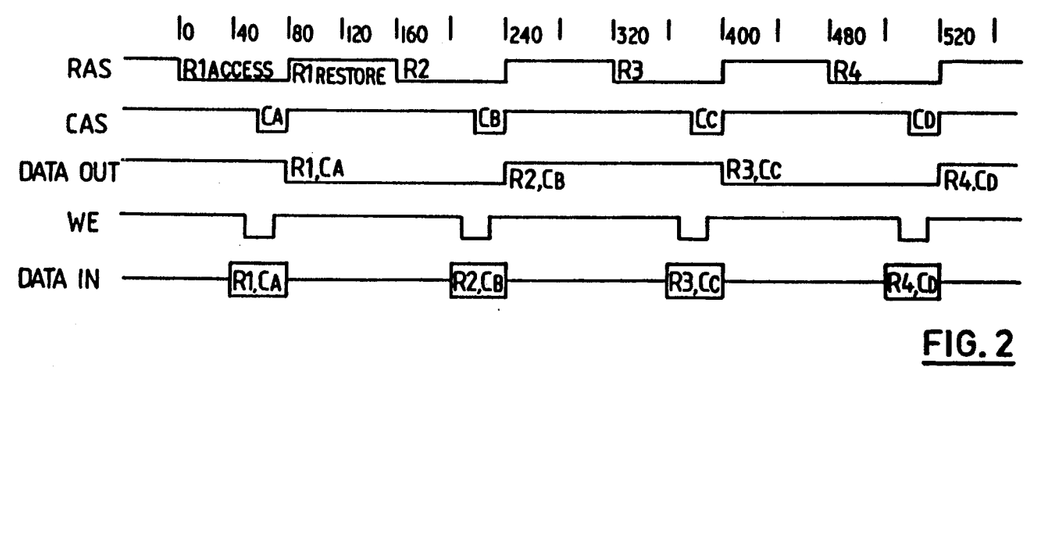
FIG. 2 shows the timing sequence necessary to update pixel data for a vertical line in a frame buffer comprised of conventional RAM using random row cycle timings, consistent with a memory having random access cycle time of 160 ns. In each cycle a row is accessed, data written (or read), the row is refreshed, and a subsequent row is accessed.

Referring to FIG. 1, assume that pixel data for a horizontal line is stored along adjacent column locations in a row of memory (e.g. C[a], C[a+1], C[a+2], etc.) while vertical lines are stored in a column across multiple rows (e.g. C[a], C[b], C[c], etc.). It will be appreciated that other storage conventions may be used In this general case, page mode can be used for plotting straight horizontal lines by simply accessing sequential storage cells on a row in page mode. However, page mode provides no benefit for vertical lines, and little, if any benefit for lines at intermediate angles or for curves. As shown in FIG. 2, continuous RAS cycles are needed to access each pixel, C[a], C[b], C[c], along a given vertical line. As a result, performance decreases dramatically for continuous row-to-row accesses.

The primary problem the inventors had to address was a solution to the spatial difference in updating or plotting performance of a display. On analyzing the problem it was realized that it resulted from the basic hardware constraints of random access memories with page mode.

SUMMARY OF THE INVENTION

An object of the invention is to provide an access method that can access both adjacent column bits and adjacent row bits in an efficient manner.

Another object of the invention is to provide a memory which provided the speed advantages of page mode, without losing such speed advantages when performing row-to-row accesses.

A memory comprising first and second arrays, each array comprising a plurality of memory cells arranged into rows that are accessed in response to a binary address signal, each of said rows being assigned binary addresses, wherein first and second rows having adjacent binary addresses are located in said first and second arrays, respectively, and means for accessing said first and second arrays by accessing rows having adjacent binary addresses.

A random access memory in accordance with the invention finds particular, but not exclusive application as a display memory for a display system. Accordingly, the invention also relates to display memory comprising a random access memory as defined above and a display system incorporating a display memory. The invention also relates to a method of accessing a random access memory and a method of plotting a line in a display system incorporating such a random access memory.

DESCRIPTION OF THE DRAWINGS

The foregoing and other structures and teachings of the invention are described hereinafter with reference to the accompanying drawings, in which.

DESCRIPTION OF THE BEST MODE FOR CARRYING OUT THE INVENTION

In the description to follow, the terms "row" and "column" are used herein as labels for first and second dimensions of memory; this being the conventional nomenclature in the art. These terms "row" and "column" are thus to be understood as such; however, the invention could be applied to accessing the "columns" first and then the "rows." Similarly, the term "page mode" is to be understood as a generic term covering an access mechanism enabling, within an access cycle for a first memory dimension, multiple accesses for a second memory dimension. Thus, the term "page mode" is to be interpreted herein as covering a memory access mechanism sometimes referred to as "static column mode" and other such access mechanisms.

The invention is applicable to all memories operable under such modes, including SRAM, DRAM, VRAM, and various types of ROM. Indeed, although examples of the invention are described for memories which are organized in two-dimensions and receive two address components (ie. row and column), the invention is also applicable to memories which are organized with more than two dimensions and receive address components for each dimension.

Preferably, the control means is responsive to a row change signal (RC) supplied to said memory when a column address strobe (CAS) becomes active to step said row address. The stepping of the row address for a particular column cycle within a row cycle can thereby be achieved with a minimum of additional information. By predefining a step to be made in response to a row change signal, then a single bit can be used to specify whether that step should occur or not for a given column cycle.

Figure 3:
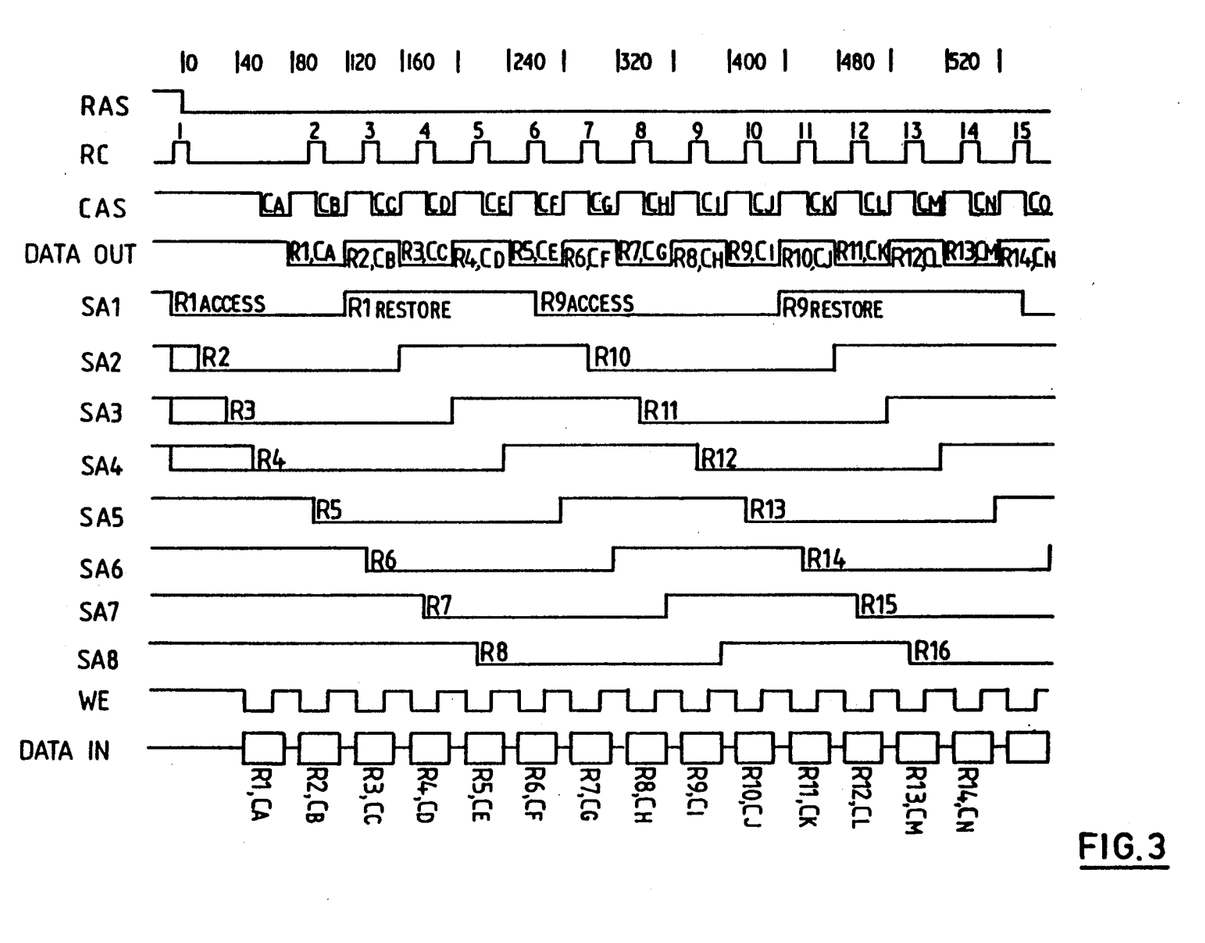
FIG. 3 shows timings associated with an embodiment of this invention for the same timing case as that of FIG. 2. Page mode timings with internal row activation are shown for both read and write cycles. Timings assume a 4:1 difference between random RAS (160 ns.) and page mode cycles (40 ns.). All timing figures are drawn with the same performance assumptions. The timings show initial row accesses occurring in both staggered and simultaneous manner demonstrating the viability of both approaches.

With reference to FIG. 3, RC is introduced as a control signal to perform the following functions:
1. At the falling RAS transition, it indicates the direction in which subsequent row accesses will occur:
   if RC=0 row addresses will be decremented,
   if RC=1 row addresses will be incremented.
2. At the falling CAS transition, it indicates when such a row change will occur:
   if RC=0 access will occur at the specified column address on the present row (R),
   if RC=1 access will occur at the specified column address on the next row address (R±1) from the present address (R), as specified in Step 1.

In order that the step to be performed can be predefined in a programmable manner, the control means is preferably responsive to a mode signal supplied to said memory when a row address strobe becomes active to set the memory in a selected row change mode. This row change mode then defines a row address step performed by said control means in response to any row change signal within that row cycle. For example, the step could be an increment or a decrement by an amount defined by the memory hardware or, for example, by values in a register.

Figure 5:
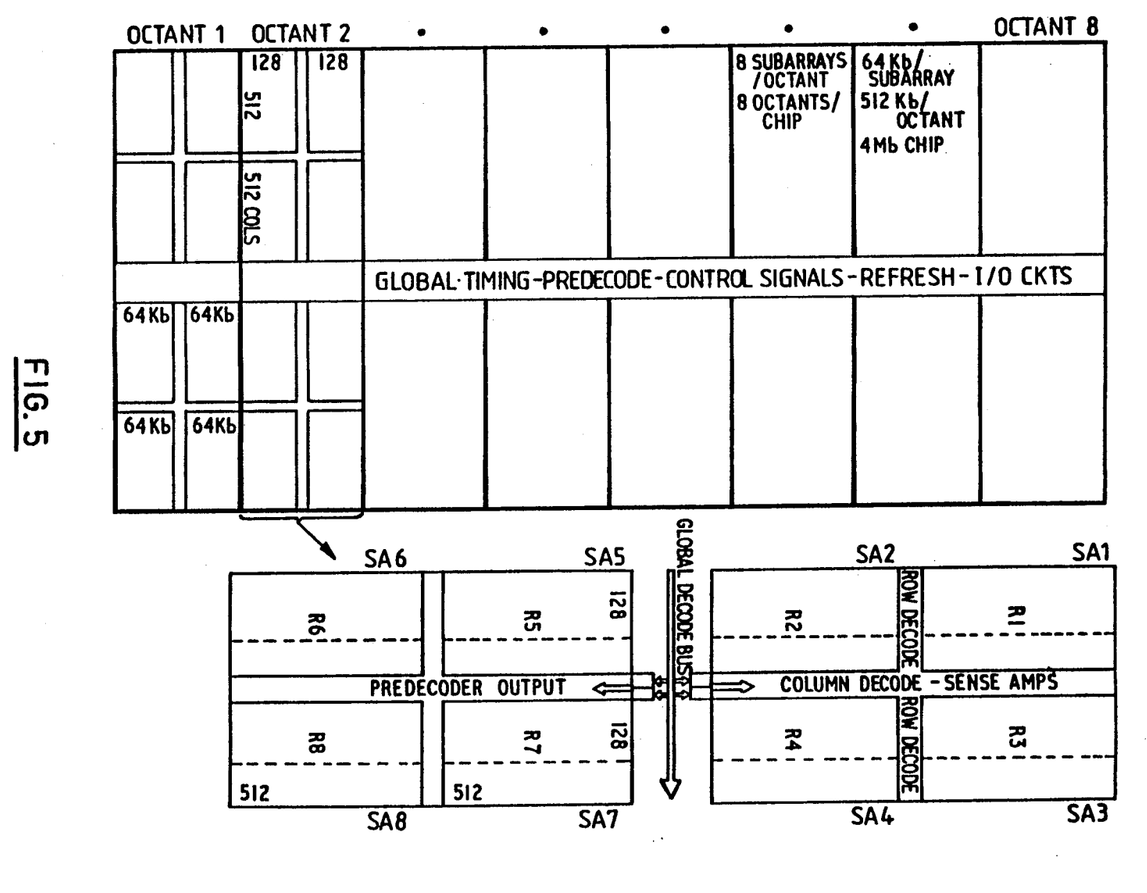
FIG. 5 illustrates an example of array segmentation for a 4 Mb random access memory with subarrays in support of the timings and block diagrams in FIGS. 3 and 4. The memory consists of 8 array blocks or octants (512 Kb) which are further subdivided into 8 subarrays (64 Kb). Each subarray is independently operable under control of global logic of FIG. 4 when operating in the row increment-decrement mode.

Although increment or decrement by one is examined, consistent with the graphics examples cited, changes of address by other predetermined amounts could be implemented by design or programmed in storage registers using RC to select the desired register. A given design architecture could support multiple increment or decrement values. In these timings a random cycle time of 160 ns and page mode cycles of 40 ns are used. This performance ratio (4:1) is typical of many random access memory designs with so-called "Fast Page Mode". The case shown demonstrates row increments based on a screen origin (0.0) the upper left corner (FIG. 1) for a vertical line with one column address update per row. Implementing the functional requirements of these timings requires the following RAM architecture and circuit enhancements:

Physical separation of rows within the increment range into distinct subarrays (FIG. 5).

Figure 4:
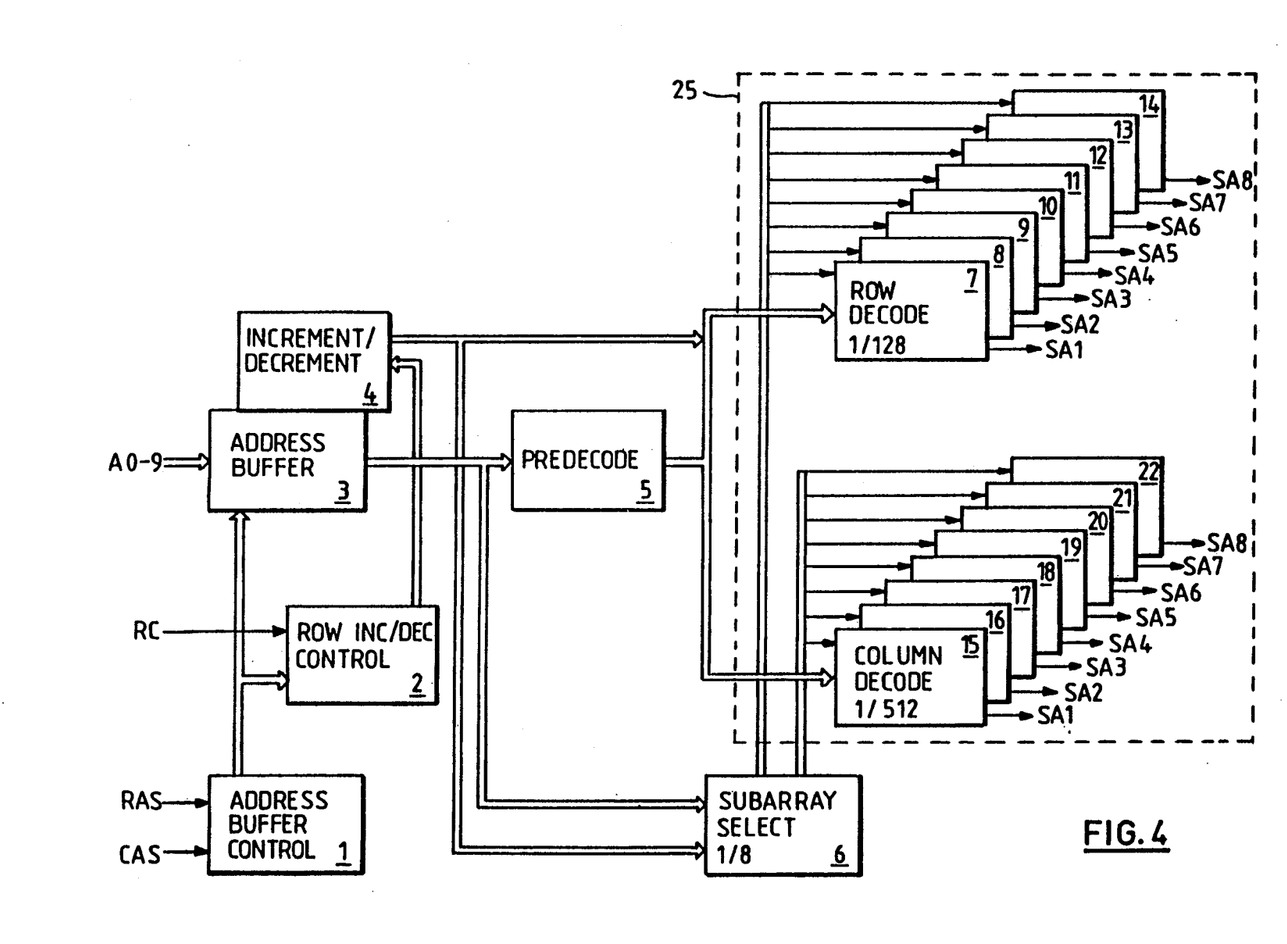
FIG. 4 illustrates the control elements required for the addressing and timing sequences within a random access memory in accordance with the invention and consistent with the timings shown in FIG. 3. The random access memory illustrated is a 4 Mb memory, organized as 512 K by 8, with 1024 rows by 512 columns by 8 data bits.

Additional supporting circuitry and control logic for independent simultaneous subarray operation, multiple subarray row decode activation, mode selection and internal row increment/decrement and restore operations (FIG. 4).

Where the memory is set in either a row increment mode or a row decrement mode in response to said mode signal, the control means is preferably responsive to a row address supplied to the memory when said row address strobe becomes active to activate the row selected by said row address and at least one row having a higher address in a row increment mode or a lower address in a row decrement mode. In this way, a second row is already activated should, during the row address cycle, a row change signal be supplied to the memory. If the incremental or decremental amount mentioned above, is plus or minus one, the activated rows will have adjacent row addresses.

Advantageously, in the case where a plurality of rows are activated simultaneously, a change in the rows activated is made when the row address is stepped in response to a row change signal.

In a preferred form of the invention, the memory is segmented into at least two segments such that at least one row address bit in a row address is used to select a memory segment and the remainder of the row address bits are used to select a row within each segment. Memory segmentation is employed in large memories in order to reduce the loading on individual rows and columns. This decreases signal generation and propagation delays while reducing both variation in data rates and power consumption. For a memory in accordance with the invention, the segmentation of the memory also enables the simplification of the simultaneous activation of a plurality of rows by placing logically sequential rows in physically separate subarrays.

The row change direction signal and/or the row change signal can be supplied on a dedicated control line to the memory. This control line can be shared between the row change direction signal and the row change signal as they are supplied at different times. Alternatively, they can be supplied in any other suitable way to the memory. For example, they could be included on a line or lines which are unused at the time when these signals need to be supplied, or could be stored as part of an instruction stored in a register.

At the initial falling RAS transition, the row change signal (RC) is positive, indicating logical row address increments are to occur for subsequent row changes specified within the initiated RAS cycle. On the initial access, the addressed row is selected (R1 in subarray SA1) as well as the next 3 rows (R2,R3,R4) in their respective subarrays (FIG. 5). Accesses to each of these subarrays may be staggered to reduce power dissipation and chip supply switching noise. Variations in parameters for optimization of the chip design must be considered when implementing the features described herein.

On the first falling CAS transition, the row change signal (RC) is negative indicating data access is to occur at the original row, R1, and at the column address specified, C[A].

On the second falling CAS transition, RC is positive directing access to the next row address, R2, and at the column address specified, C[B]. At that time, row R5 is activated in anticipation of subsequent row changes.

On the subsequent rising CAS transition, R1 is restored, after R5 access, to reduce power and noise generation. Row restore and access cycles may occur on either CAS edge and will be inherent in the control logic timing. After completion of R1 restore, subarray SA1 will be available for subsequent row access. This occurs as an access to R9 after row selection has stepped through each of the intervening subarrays. Determination of the number of subarrays and the number of initially accessed rows is made by consideration of chip architecture, RAS and CAS cycle times, word line segmentation, chip density and subarray restore time.

On each following falling CAS transition, RC invokes a row change. For the timings shown, row accesses occur sequentially in each subarray and return to subarray SA1 for row R9, by which time, row R1 in subarray SA1 has been properly restored. These timings provide row preselect and restore under control of additional logic circuitry with sufficient lead time to assure seamless data transfer at page mode data rates. For example, row R5 is selected in subarray SA5 by the second falling CAS transition. Data is available two CAS cycles later and is accessed in the next CAS cycle (C[E]). The positive transition of the second CAS cycle also restores row R1 in subarray SA1; restore being completed and subarray SA1 being available for row selection in cycle C[E]. Row R9 is selected in subarray SA1 in the cycle C[F] in response to RC. Data from row R9 becomes available in cycle C[H] and is accessed in cycle C[I].

Should RC remain negative at a given falling CAS transition, column accesses will continue in the present row as a normal page mode operation. New row selection and restore is delayed until RC specifies the present row is no longer needed and new rows are accessed. Page mode rates and timings are maintained. Write enable and data-in update timings are also indicated in the timings. CAS addressing is unchanged from that of normal page mode operation.

The process continues for subsequent cycles until RAS, returning to a high level, terminates chip select. In the example described, the row change signal specifies a new row is to be accessed in the current CAS cycle. Alternatives, such as specifying RC in one CAS cycle to be executed in the following CAS cycle, could also be incorporated in the control logic. The arrangement adopted provides flexibility, has no element of lookahead, requires no empty cycles or synchronization and represents an advantageous implementation of the invention consistent with the general class of graphic adapters and system caches.

FIG. 4 is a circuit block diagram illustrating the control elements required for addressing and timing sequences within a random access memory in accordance with the invention and consistent with the timings shown in FIG. 3. The addressing subsystem illustrated is for a 4 Mb random access memory, organized as 512K by 8, with 1024 rows by 512 columns by 8 data bits. Such a memory device requires 10 row address bits and 9 column address bits, which are provided through the 10 bit address input A0-9 shown in FIG. 4. As illustrated in FIG. 5, the memory array is physically divided into 8 octants of 512K one-bit memory locations associated with each data input/output Each octant is further subdivided into 8 subarrays, each subarray being addressed by the low-order 3 bits of the row address. The decoder circuitry 25 in FIG. 4 is repeated eight times, once for each of the eight octants. Each subarray is organized as 128 rows by 512 columns, with a single bit of data associated with each row/column pair. The subarray rows are addressed by the high-order 7 bits of the row address. The subarray columns are addressed by the 9 bit column address.

FIG. 4 illustrates the circuit blocks and control signals/buses of the addressing subsystem for a conventional random access memory with the addition of circuit blocks and control signals/buses for a random access memory in accordance with the invention. The additional circuit blocks are the Row Increment-/Decrement Control circuit 2 and the Increment-/Decrement circuit 4. The additional control signals/buses are those to and from the additional circuit blocks.

The address buffer control circuit 1 supervises the address multiplexing of the address buffer 3. The row address and the column address are obtained, at the falling transitions of RAS and CAS respectively, from the address input A0-9. The address buffer control circuit 1 also supervises the operation of the row increment/decrement control circuit 2 which obtains row change direction and row stepping instructions, at the falling transitions of RAS and CAS respectively, from the row change input RC. The address buffer control circuit 1 generates the timing information for the addressing subsystem of the random access memory from the RAS and CAS inputs.

For a conventional single row memory access, at the falling transition of RAS, the row address is passed from the address buffer 3 through the predecoder 5 to the row decoders 7-14 which decode the most significant seven bits of the row address. The least significant three bits of the row address are passed from the address buffer 3 to the subarray select circuit 6 that determines which of the eight subarrays is being addressed. The subarray select circuit 6 selects one of the eight subarrays causing one of the row decoders 7-14 to access the addressed row. At the falling transition of CAS, the column address is passed from the address buffer 3 through the predecoder 5 to the column decoders 15-22 which decode the nine bit column address to determine which of the 512 columns is being addressed. The subarray select circuit 6 controls which of the eight subarray column decoders is selected.

When operating in row increment/decrement page mode, row addressing is performed by the increment/decrement circuit 4 under control of the row increment/decrement control circuit 2 using RC for row address selection and RAS/CAS timing information from the address buffer control circuit 1. Column addressing remains unchanged.

On the falling transition of RAS, the initial row address is passed from the address buffer 3 to the increment/decrement circuit 4. The row change direction is obtained by the row increment/decrement control circuit 2 from the level of the RC input at the falling transition of RAS. The most significant seven bits of the initial row address are passed, by the increment/decrement circuit 4, to the row decoders 7-14. The increment/decrement circuit 4 directs the subarray select circuit 6 to select one of the eight subarrays, based on the least significant three bits of the initial row address, in order to start access to the initially addressed row. The increment/decrement circuit 4 also directs the subarray select circuit 6 to select further subarrays to initiate access to further logically sequential rows.

On falling transitions of CAS, column addresses are passed from the address buffer 3 through the predecoder 5 to the column decoders 15-22. Row change instructions are obtained by the row increment/decrement control circuit 2 from the level of the RC input at the falling transitions of CAS. The increment/decrement circuit 4 directs the subarray select circuit 6 to select the column decoder of the subarray for the row being addressed in the active CAS period. Under the direction of the increment/decrement circuit 4, in response to row change instructions, the subarray select circuit 6 executes the stepping sequence of row increment/decrement by changing the selects to the subarray row decoders 7-14. To initiate access to further sequential rows, the subarray select circuit 6 activates the select to the subarray row decoder that is next in the sequence. The increment/decrement circuit 4 supplies the most significant seven bits of the row address to the newly selected row decoder. To initiate row restore for rows that have been passed in the sequence, the subarray select circuit 6 deactivates the select to the affected row decoder.

Figure 6:
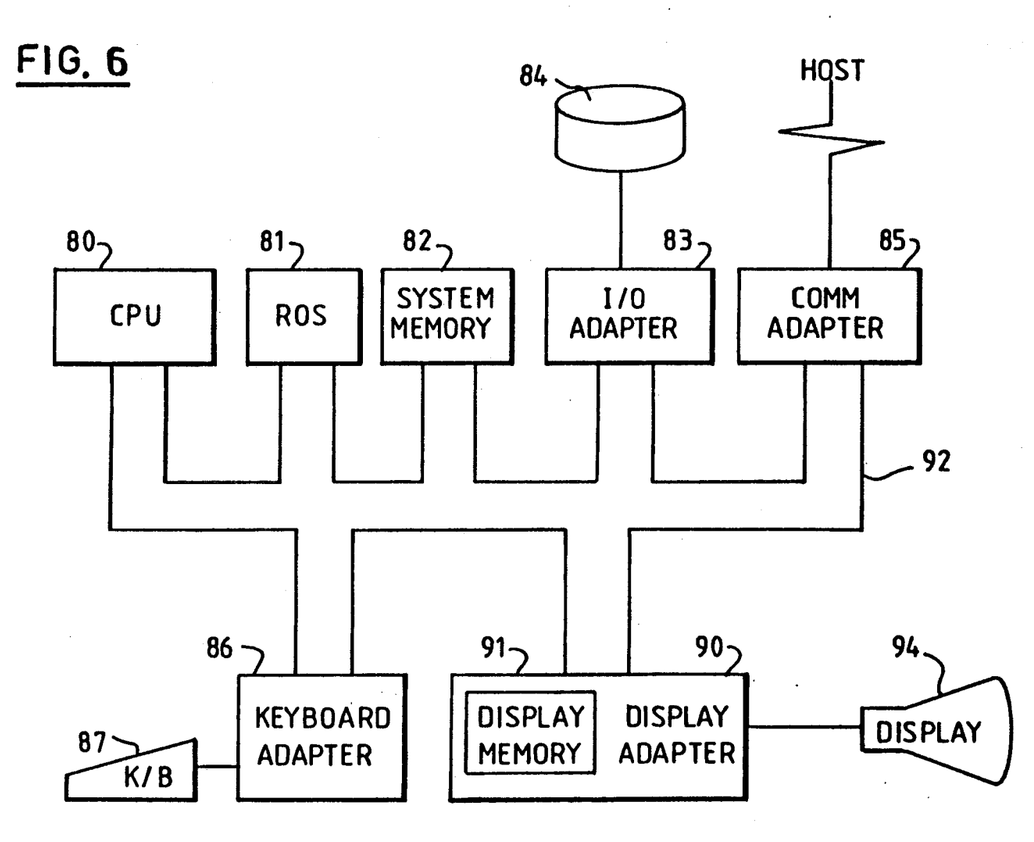
FIG. 6 is an example of a typical workstation graphics display subsystem using memory in accordance with the invention to enhance overall system performance.

Memory in accordance with this invention can be used for the frame buffer of a graphics display system such as that shown in FIG. 6 in the form of a workstation. The workstation is comprised of a central processing unit 80 in the form of a conventional microprocessor and a number of other units including a display adapter 90 which incorporates the display memory 91. The various units are connected to the microprocessor via a system bus 92. Connected to the system bus are a system memory 82 and a read only store (ROS) 81. The operation of the microprocessor is controlled by operation system and application code stored in the ROS and RAM. An I/O adapter 83 is provided for connecting the system bus to the peripheral devices 84 such as disk units. Similarly, a communications adapter 85 is provided for connecting the workstation to external processors (eg. a host computer). A keyboard 87 is connected to the system bus via a keyboard adapter 86. The display adapter 90 is used for controlling the display of data on a display device 94.

The workstation performs a wide variety of tasks. One class of task is the generation of lines in a graphics application. This can be done by an iterative algorithm generally known as Bresenham's Line Algorithm. The algorithm consists in defining an initial horizontal and vertical line location, then for each horizontal address location calculates an error term which determines whether a step should be made in the orthogonal direction. While very efficient, plotting performance of such algorithms is constrained in prior art displays due to the frame buffer memory technology, which allows page mode pixel storage only in the horizontal direction. Random cycle performance occurs during every orthogonal change with worst case performance (vertical line draw) approaching random cycle timings. However, a display memory using random access memory in accordance with the invention, can achieve plotting performance approaching page mode frequencies. The operations required for updating a line in a display system having a frame buffer comprised of a random access memory in accordance with the invention are summarized below:

A. Determine initial row and column addresses for a starting point on the line and a direction for subsequent points on the line.

B. Generate a row change mode signal representative of that direction for subsequent points of the line and supply the mode signal and the initial row address to the memory when a row address strobe becomes active; thus setting the memory in an appropriate row change mode and selecting an initial row address.

C. When a first column address strobe becomes active, supply the initial column address to the memory for accessing a location specified by the initial row and column addresses and for plotting pixel data at that location.

D. Determine, in accordance with the incremental line drawing algorithm, the column address for a subsequent point on the line and an error term which is used as a row change signal, indicating whether, or not, a row change is required for the subsequent point.

E. Supply the column address and row change signal to the memory when a subsequent column address strobe becomes active for accessing the appropriate location for that subsequent point and for plotting pixel data at that location.

F. Repeat steps (D) and (E) for subsequent points on the line until the line update is complete.

Although described above with respect to specific examples, the invention is not limited thereto, and many additions and modifications are possible within the scope of the claimed invention.

For example, although the mode signal and the row change signal are both supplied on a shared RC line at their appropriate timings, they could be supplied on separate dedicated lines, or on lines which are otherwise not used at the timings in question. In memories such as that described above, requiring more row address bits than column address bits, the row change signal could be supplied on one of address lines not used during the column cycles. If moreover, the mode signal is supplied on an input (e.g. a function pin) for the memory which is unused when RAS becomes active, or by coding signals on other inputs, or from data in a register, it can then be seen that the invention can be implemented without requiring a special input line to the memory for the mode and row change signals.

Also, in the described example, the choice of row change mode is between a row increment and a row decrement mode. However, different row change modes could be defined. For example the choice may be between a positive and zero row increment. This choice might be desirable for simulating double length rows. Also, the control means could be designed to respond to a multibit row change signal whereby a choice of more than two row change modes could be offered. Also, control means could be implemented whereby the direction and/or magnitude of row changes may be altered during the page mode cycle. Where such a memory were used in a graphics display system this would give a high degree of flexibility for plotting curves, circles, arcs or other complex graphical shapes, whilst maintaining the performance benefits of page mode.

We claim:

1. In a memory comprising first and second arrays, each array comprising a plurality f memory cells arranged into rows and columns, each of said rows having a respective binary address, a method of accessing a plurality of rows having sequential binary address in response to receipt by the memory of a single binary address signal, comprising the steps of:
   a) accessing a first row of memory cells in said first array;
   b) accessing a first row of memory cells in said second array, while restoring said first row of memory cells in said first array;
   c) accessing a second row of memory cells in said first array, while restoring said second row of memory cells in said first array;
   (d) accessing a second row of memory cells in said second array, while restoring said second row of memory cells in said first array; and
   e) restoring said second row of memory cells in said second array.

2. A memory comprising first and second arrays, each array comprising a plurality of memory cells arranged into rows that are accessed in response to a binary address signal, each of said rows being assigned binary addresses, wherein first and second rows having adjacent binary addresses are located n said first and second arrays, respectively, and means for accessing said first and second arrays sequentially by accessing rows having adjacent binary addresses by sequentially incrementing or decrementing a received binary address signal.

3. A memory having a plurality of rows and columns and operable in a given page mode cycle such that a row address is selected for a row cycle and within said row cycle a plurality of column cycles are performed to access the memory at selected column addresses, wherein said memory additionally comprises control means for stepping the row address for selected column cycles within said given page mode cycle.

4. A memory as claimed in claim 3 wherein said control means is responsive to a row change signal supplied to said memory when a column address strobe becomes active for stepping said row address.

5. A memory as claimed in claim 4 wherein said control means is responsive to a mode signal supplied to said memory when a row address strobe becomes active to set said memory in a selected row change mode, said row change mode defining a row address increment performed by said control means in response to said row change signal.

6. A memory as claimed in claim 4 wherein said control means sets said memory in either a row increment mode or a row decrement mode in response to said mode signal, and wherein said control means is responsive to a row address supplied to said memory when said row address strobe becomes active for activating the row selected by said row address and at least one further row having a higher address in a row increment mode or a lower address in a row decrement mode.

7. A memory as claimed in claim 6 wherein said control means is responsive to said row change signal when in a row increment mode to deactivate the row having the lowest address currently activated and to activate a row having a higher address, and when in a row decrement mode to deactivate the row having the highest address currently activated and to activate a row having a lower address.

8. A memory as claimed in claim 3 wherein said memory is segmented into at least two segments, and wherein said control means is arranged such that a maximum of one row in each segment may be in an activated state for a column cycle.

9. In a memory addressable by row and by column and operable in page mode such that a row address is selected for a row cycle and within said row cycle a plurality of column cycles are performed to access the memory at selected column addresses, a method of changing the row accessed for selected column accesses comprising the steps of:
   a) setting the memory in a selected row change mode in response to a mode signal which is supplied to the memory when a row address strobe becomes active, said row change mode defining a row address step to be performed in response to a row change signal; and
   b) stepping the row address as defined by the row change mode in response to a row change signal supplied to the memory when a column address strobe becomes active.

10. A method as claimed in claim 9 wherein step (a) additionally comprises the sub-step of:
   (a)(i) responding to a row address supplied to the memory when said row address strobe becomes active to activate the row selected by the row address and at least one further row having a higher address in a first mode or at least one further row having a lower address in a second mode.

11. A memory as claimed in claim 10, wherein said memory comprises a plurality of arrays of memory cells having rows with different addresses, wherein when a first row is accessed in a first of sad plurality of arrays, rows having logically adjacent addresses are activated in remaining ones of said plurality of arrays, and are sequentially accessed in sequential column address strobe cycles.

12. A memory as claimed in claim 9, wherein said row address strobe is not deactivated before said row address is stepped.

* * * * *